United States Patent [19]
Desmond et al.

[11] 3,797,103
[45] Mar. 19, 1974

[54] MACHINE AND PROCESS FOR SEMICONDUCTOR DEVICE ASSEMBLY

[75] Inventors: Richard J. Desmond, North Syracuse; Edward J. Fronczek, Auburn; John J. McCarthy, Port Byron, all of N.Y.

[73] Assignee: General Electric Company, Syracuse, N.Y.

[22] Filed: Nov. 10, 1971

[21] Appl. No.: 197,535

Related U.S. Application Data

[62] Division of Ser. No. 34,042, May 4, 1970, Pat. No. 3,669,478.

[52] U.S. Cl. .......... 29/583, 29/588, 29/589, 29/470.5
[51] Int. Cl. .......... B01j 17/00
[58] Field of Search .......... 29/588, 589, 470.5, 483, 29/583

[56] References Cited

UNITED STATES PATENTS

| | | | |
|---|---|---|---|
| 3,290,772 | 12/1966 | Crouch | 29/470.5 |
| 3,478,420 | 11/1969 | Grimes | 29/589 |
| 3,597,666 | 8/1971 | Taskovich | 29/589 |
| 3,706,915 | 12/1972 | Lootens | 29/589 |

*Primary Examiner*—Charles W. Lanham
*Assistant Examiner*—W. C. Tupman
*Attorney, Agent, or Firm*—Robert J. Mooney

[57] ABSTRACT

A machine and process are disclosed for assembling a plurality of semiconductor devices having heat sinks initially united in a common strip. A track is provided for allowing a heat sink strip to be sequentially transported through a plurality of assembly stations. A magazine is provided for dispensing heat sink strips to the track. The strip is advanced by fingers engaging regularly recurring apertures in the strip. The heat sink strip is first burred and then a solder preform is stamped onto the strip at spaced intervals overlying the burrs. Lead carrying headers are fed into association with spaced foot portions of the strip. A dispenser feeds a solder ball to a window in each header. A forming and pick up mechanism positions sub-assemblies including semiconductive elements and internal connectors on the heat sink strip overlying the solder preforms.

3 Claims, 22 Drawing Figures

MACHINE AND PROCESS FOR SEMICONDUCTOR DEVICE ASSEMBLY

This application is a division of application Ser. No. 34,042 filed May 4, 1970, now U.S. Pat. No. 3,669,478.

Our invention is directed to a machine for assembling a plurality of semiconductor devices having heat sinks initially united in a common strip.

A variety of semiconductor devices are in use incorporating a generally flat heat sink stamped from a heat sink strip which is initially common to a number of devices. Construction of devices from common heat sink strips is advantageous in that it avoids the necessity of separately handling and positioning individual device elements during manufacture.

While our assembly machine may be readily applied to the assembly of a variety of semiconductor devices of common heat sink strip genesis, it is considered that it may be best described by reference to a specific semiconductor device construction. An exemplary device suitable for assembly by our machine is illustrated in FIGS. 1 through 3 inclusive, in which FIG. 1 is an exploded perspective view of the semiconductor device prior to encapsulation;

FIG. 2 is a vertical section of the semiconductor device of FIG. 1 in its finally assembled state; and FIG. 3 is a sectional detail showing the association of an internal connector and a heat sink with a semiconductor body.

The semiconductor device 100 shown in FIG. 2 includes a semiconductor body or pellet 102 which is joined to an electrically conductive heat sink 104 by a group of bonding layers 106 and to an internal connector 108 by a group of bonding layers 110. For ease of illustration in FIG. 1 the semiconductor body and bonding groups are depicted as a single element 112. In FIG. 3 a preferred form of the bonding groups is shown. A conventional three layer contact system is adhered to opposite major surfaces of the semiconductor body. In a specific illustrative form the layers 114 next adjacent the semiconductor body may be formed of chromium, the layers 116 may be formed of nickel, and the layers 118 may be formed of silver. As is well understood in the art the function of the contact layers is to condition the surface of the semiconductor body so that it can be readily bonded to solder layers 120. The solder layers bond the semiconductor body to the heat sink and to the internal connectors.

Referring to FIG. 1, a second internal connector 122 is shown attached to the element 112 in laterally spaced relation to the internal connector 108. The internal connector 108 is provided with an upstanding flange portion 124, and the second connector is provided with a similar upstanding flange portion 126. The heat sink is provided with a laterally extending tab portion 128 having a centrally located aperture 130 to facilitate thermal engagement of the heat sink with a structure capable of receiving and dissipating heat, such as a chassis or a heat fin array. Along an opposite edge of the heat sink an upstanding foot portion 132 is integrally joined. As shown, the foot portion initially lies in the plane of the heat sink and is bent to a perpendicular orientation. The upper edge of the foot portion is provided with a groove 134.

A rigid insulative header 136 is provided with a central window 138 which is sized to slidably fit over the foot portion of the heat sink. The header carries three spaced parallel leads 140, 142, and 144. Leads 140 and 144 pass through the header without intersecting the window 138, but tangentially engage the outer surfaces of flanges 124 and 126 of the connectors. The leads are soldered to the upstanding flanges along their length to assure a low resistance electrical interconnection. The lead 142 is slidably fitted into the groove 134 in the foot portion of the heat sink and is soldered thereto at 146. The bonding group 110 underlies the internal connectors, but is interrupted so that it does not bridge the connectors. Accordingly, it is apparent that the lead 142 provides an electrical conduction path to the lower major surface of the semiconductor body, the lead 140 provides an electrical conduction path to a major portion of the upper surface of the semiconductor body, and the lead 144 provides an electrical conduction path to a laterally displaced portion of the upper surface of the semiconductor body. In the form shown the semiconductor body may be a transistor or a gate controlled thyristor semiconductor body. Where the semiconductor body is a diode or Shockley diode the lead 144 and connector 122 may be omitted. A passivant body 148 formed of a material such as silicone rubber is shown surrounding the semiconductor body exposed edges and a plastic housing 150 is shown molded to the heat sink and encapsulating the passivant material, semiconductor body, and header.

It is an object of our invention to provide a machine to facilitate the assembly of a common heat sink strip type of semiconductor device such as, for example, the device 100.

This and other objects of our invention are accomplished in one aspect by an apparatus for the assembly of a plurality of semiconductor devices comprising a track for allowing a heat sink strip to be sequentially transported through a plurality of assembly stations. A magazine is provided for dispensing heat sink strips to the track. Means are provided for advancing the heat sink strips in fixed stepped increments. Means for associating a first bonding material with the heat sink strip at predetermined spaced areas is provided. Means are provided for associating with the heat sink strip multileaded headers in fixed spatial relation with the spaced areas and for associating a second bonding material with a lead of each header and the heat sink strip. Further, means are provided for superimposing a subassembly comprised of a semiconductor body and an internal connector over the first bonding material at each spaced area with the internal connector positioned in contact with a remaining header lead.

In another aspect our invention is directed to an apparatus for the assembly of a plurality of semiconductor devices including an initially common heat sink strip comprising feed means for allowing the heat sink strip to be advanced therealong in fixed stepped increments. A magazine is mounted in spaced relation to the feed means including a recess for storing a plurality of sub-assemblies each including a semiconductor element and at least one internal connector secured thereto. Means are mounted between the magazine and the feed means for facilitating forming of the internal connectors, and means are provided for selectively transporting a sub-assembly from the magazine to the forming means and from the bending means to the heat sink strip.

In still another aspect our invention is directed to a process for the assembly of a plurality of semiconductor devices having heat sinks initially united in a common strip. A heat sink strip is advanced along a track and burred. Bonding preforms having oxidized surfaces are associated with the burred portions of the heat sink strip at spaced intervals so that the oxidized surfaces are penetratd by the burrs and the solder preforms are fastened to the strip. Leads are insulatively positioned at spaced intervals along the heat sink strip. A sub-assembly comprised of a semiconductor body and an internal connector is superimposed over each bonding preform and simultaneously each internal connector is positioned to contact a lead with a bonding material interposed therebetween. The internal connectors are bonded to the leads and the semiconductor bodies to the heat sink strip. The semiconductor bodies are protectively encapsulated, and the strip is sub-divided to form plural discrete semiconductor devices.

Our invention may be better understood by reference to the following detailed description considered in conjunction with the drawings relating to our machine, in which FIG. 4 is a schematic diagram of machine stations;

Figure 4:
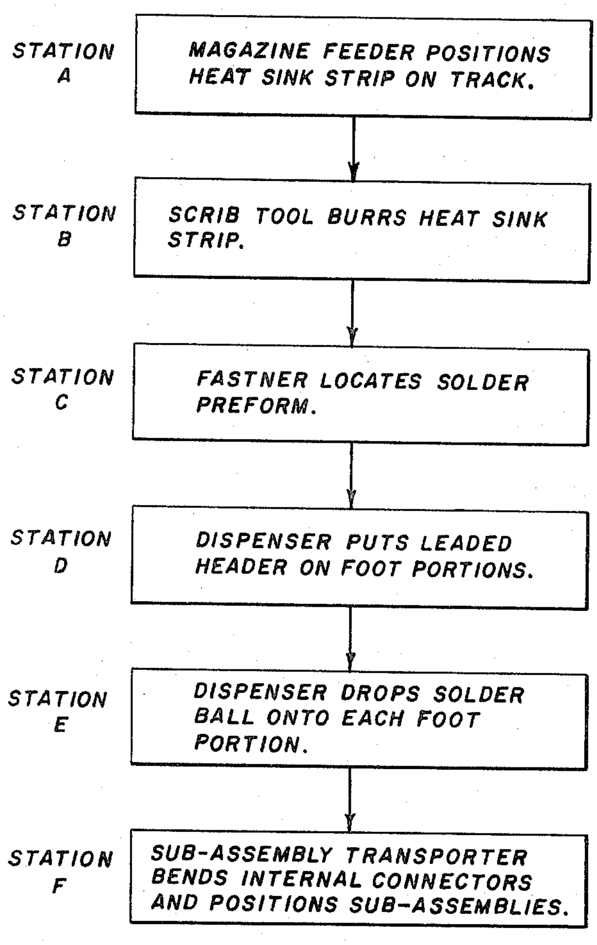

Our assembly machine advances a heat sink strip along a track through a plurality of stations where operations are performed that contribute to the assembly of semiconductor devices to be formed initially having the heat sink strip in common. The over-all character of our machine may be best appreciated by reference to FIG. 4, which shows our machine to be made up of a plurality of stations A through F.

Figure 5:
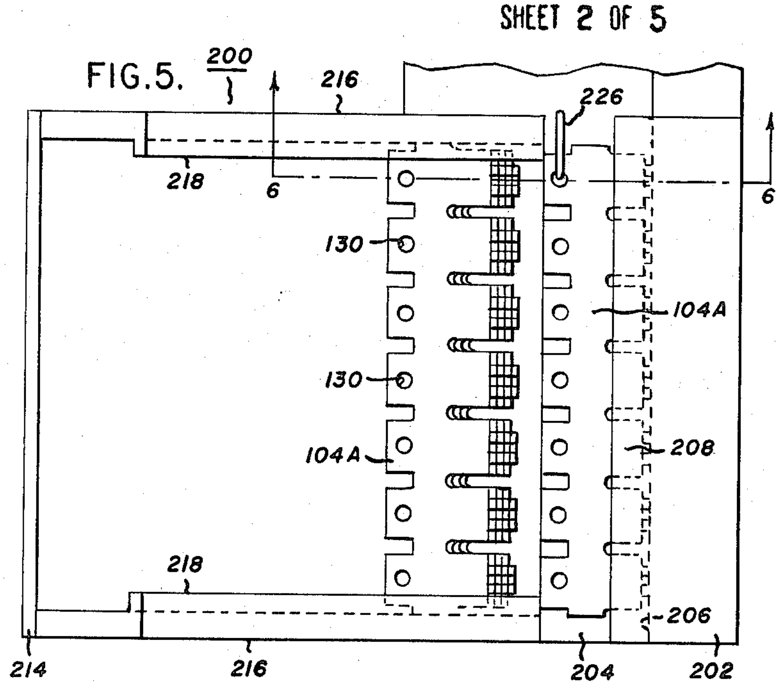
FIG. 5 is a plan view of a heat sink strip magazine.
Figure 6:
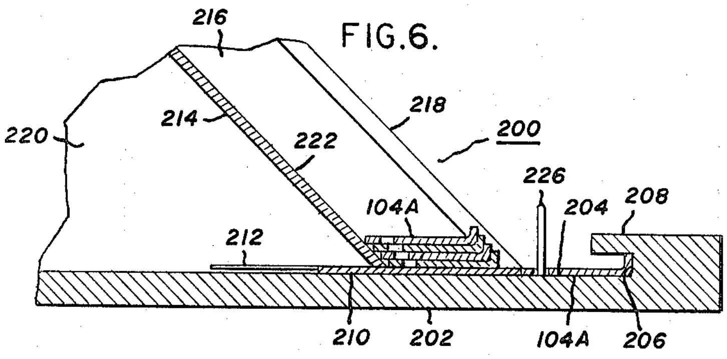
FIG. 6 is a section taken along section line 6—6 in FIG. 5.

The construction and operation of our machine at station A is best appreciated by reference to FIGS. 5 and 6. At station A the machine is comprised of a magazine 200 which includes as an element thereof a track 202. The track provides an upper surface or bed 204 intended to support a heat sink strip 104A. The track also includes a guide surface 206 intended to engage the foot portions of the heat sink strip to limit lateral movement thereof. A cantilevered portion 208 of the track is spaced vertically above the bed to engage the foot portions of the heat sink strip and to assure that the heat sink strip does not ride up over the guide surface. A feeder knife 210 is supported by the track bed and urges the heat sink strip 104A against the guide surface. An operator arm 212 extends from the rear edge of the feeder knife to permit retraction of the feeder knife.

At any one time only one heat sink strip 104A is located between the forward edge of the feeder knife and the guide surface. Additional heat sink strips are supported on the upper surface of the feeder knife. These heat sink strips are stacked along an inclined plane defined by a rear retainer wall 214. To hold the strips in position and to prevent the strips from being moved forward by the feeder knife edge retainers 216 are provided. Each edge retainer is provided with an overhanging lip 218 which engages each heat sink strip along its endmost edges just beyond the endmost foot portions. The rear retainer wall and edge retainers terminate above the bed of the track at a distance just slightly greater than the thickness of the feeder knife to permit the feeder knife to pass therebetween. Mounting walls 220 may be provided at opposite sides of the rear retainer wall to mount this wall and the edge retainers at the desired angle with respect to the track and to provide a lateral guide for the feeder knife.

To utilize the magazine 200 a plurality of heat sink strips 104A are stacked beween the rear retainer wall 214 and the lips 218 of the lateral retainer walls 216 and rest on the upper surface of the feeder knife 210. To selectively feed a strip to the bed 204 of the track it is merely necessary to retract the feeder knife using the operator arm 212 so that its leading edge lies behind the leading surface 222 of the rear retainer wall. The stack of strips then moves downwardly until the lowermost strip is supported by the bed. When the feeder knife is again moved forward, it pushes the lowermost strip from the stack so that it is laterally displaced to engage the guide surface 206. The remaining strips in the stack are restrained from movement by the lips 218.

It is appreciated that the feeder knife may be operated by hand, if desired. Alternatively, it is appreciated that the feeder knife may be actuated by any source capable of supplying a controllable rectilinear movement. In a preferred form an actuating mechanism may be incorporated in which the feeder knife is continuously spring biased forward. When the heat sink strip resting on the bed is advanced along the track so that it no longer restrains forward movement of the feeder knife, the knife is biased forward toward the guide surface 206. This triggers a retracting mechanism that retracts the feeder knife rearwardly permitting another heat sink strip to be positioned on the bed and permitting the feed cycle to be repeated.

Figure 8:
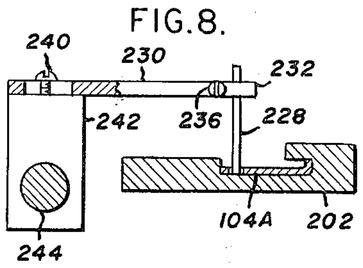
FIG. 8 is an elevation, partly in section, of a portion of the advancing mechanism.
Figure 9:
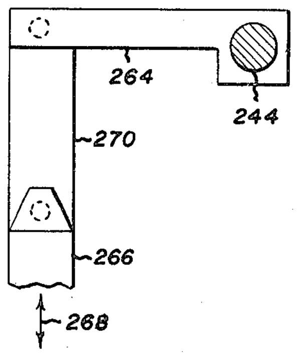
FIG. 9 is a section taken along section line 9—9 in FIG. 7.
Figure 7:
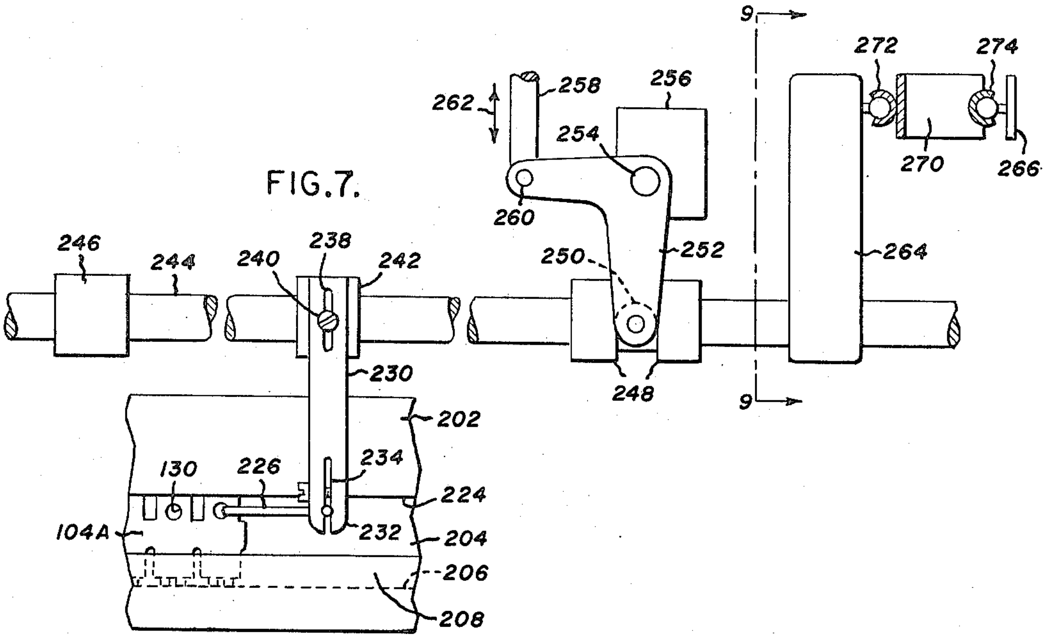
FIG. 7 is a plan view, with portions broken away, of the strip advancing mechanism of our machine.

In order to advance the heat sink strips from station A through the subsequent stations of the machine in a plurality of uniform stepped increments of advance and, if desired, in timed relation with operations at one or more stations, an advancing mechanism for the heat sink strips is provided as shown in FIGS. 7, 8 and 9.

The track 202, which may be a continuous extension of the track at the magazine station, differs from the configuration of the track at the magazine in that the bed 204 is restricted in width and a second guide surface 224 is provided opposed to and spaced from the guide surface 206. The second guide surface is desirable, since once the heat sink strips are advanced from the magazine station, there is no knife feeder to urge the strips against the guide surface 206. At the same time it is not necessary to provide a cantilevered portion above the guide surfaces, since no biasing force is being applied to the strips that would normally cause them to ride up over the guide surfaces. As an added precaution, however, such cantilevered portions, similar to track portion 208, can be provided above one or both guide surfaces.

The advancing mechanism includes one or more fingers that are intended to engage a relieved portion of the heat sink strip which recurs at regular intervals corresponding to the spacing of semiconductor devices to be formed from the heat sink strip. The mounting apertures 130 provide one such convenient regularly recurring relieved feature of the heat sink strips. The finger may extend downwardly and laterally to the aperture similarly as the fingers 226 shown in FIGS. 5, 6, and 7 or the fingers may extend directly downwardly similarly as the finger 228 shown in FIG. 8. The fingers are releasably and adjustably mounted by finger holders 230. The forward end 232 of the finger holder is provided with a slot 234 into which the finger is fitted. An adjustment screw 236 controls the compression with which the finger is held by the finger holder. The rear extremity of the finger holder is provided with a slot 238 whereby the finger holder may be adjustably positioned on a mounting block 242 by a mounting screw 240. The mounting block is fixedly secured to a mandrel 244 having its longitudinal axis positioned parallel with the bed of the track. The mandrel is slidably and rotatably mounted by a support member 246 which is fixedly positioned with respect to the track. One or a plurality of support members may be employed.

To allow the mandrel to be shifted through a fixed increment along its longitudinal axis spaced collars 248 are fixed to the mandrel. An actuator knob 250 is fitted into the space between the collars and is rotatably associated with a shift arm 252. The shift arm is pivotally associated with a mounting pin 254 supported by a mounting block 256 fixedly positioned with respect to the track by interconnecting structure, not shown. The shift arm also has rotatably associated with it an actuator arm 258 having a rotatable pin connection 260. The actuator may be moved back and forth through a fixed increment as indicated by arrow 262.

In order to permit the mandrel to be rotated about its longitudinal axis through a fixed angular distance a rotator arm 264 is fixedly secured to the mandrel. A second actuator arm 266 capable of rectilinear movement through a fixed increment indicated by arrow 268 in FIG. 9 is connected to the rotator arm by an intermediate strap 270 having ball joint interconnections 272 and 274 to the rotator arm and the second actuator arm, respectively.

In operation of the advancement mechanism, the actuator arm 258 is initially pushed toward the track in the direction of arrow 262. This rotates the shift arm 252 about mounting pin 254 to move the actuator knob 250 in the right in FIG. 7. The actuator knob due to its association with the collars 248 moves the mandrel 244 through a fixed increment of travel along its longitudinal axis. This in turn causes the finger 226 associated with a mounting aperture in the heat sink strip to advance the heat sink strip by a corresponding increment. To disengage the finger from the mounting aperture the second actuator arm 266 is moved downwardly through a fixed increment in the direction of the arrow 268 in FIG. 9. This moves the rotator arm 264 and mandrel through a predetermined angle of rotation. Rotation of the mandrel rotates the mounting block 242 and raises the end of the finger above the heat sink strip so that it is disengaged therefrom. The actuator arm 258 is then returned to its original position causing the mandrel to be shifted along its longitudinal axis to its original position. The ball joint interconnections 272 and 274 allow the rotator arm to be freely shifted longitudinally with the mandrel even when the second actuator arm 266 is fixedly held in position. After the mandrel has returned to its initial longitudinal position, the second actuator arm is moved upwardly in the direction of the arrow 268. This allows the finger to drop down to the bed of the track and to enter the mounting aperture or other regularly recurring relieved portion therebeneath. It is to be noted, however, that the finger does not re-enter the mounting aperture with which it is originally associated, but instead engages the next following aperture, since the heat sink strip has been advanced by an increment corresponding to the spacing of the apertures. To achieve the next increment of advancement the above procedure is merely repeated.

It is appreciated that only one finger is essential in order to advance the heat sink strips through all stations of our machine. This is the finger 226 shown in FIGS. 5 and 6. This finger engages the last strip fed by the magazine and accordingly can push this strip against all strips at or advancing to subsequent stations, so that movement of this one finger imparts a corresponding movement to all strips. It is preferred to provide fingers adjacent all stations, however, so that a strip can be pulled through all stations even though there are no following strips.

Figure 10:
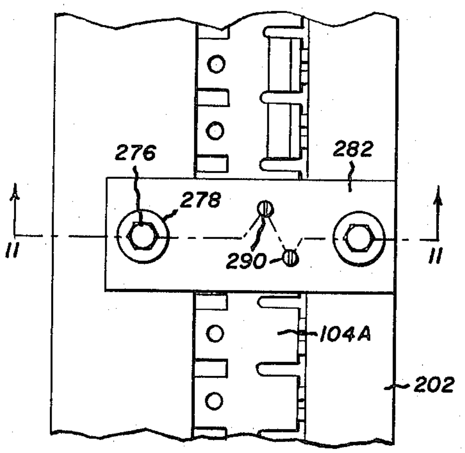
FIG. 10 is a plan view of the scribing station.
Figure 11:
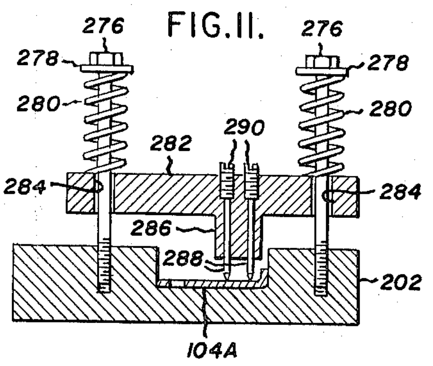
FIG. 11 is a section taken along section line 11—11 in FIG. 10.

Station B of our machine is illustrated in FIGS. 10 and 11. The track 202 has threadedly secured thereto restraining bolts 276 having washers 278 thereon for restraining upward travel of compression springs 280. The lower ends of the compression springs engage a scribe holder 282. The scribe holder is provided with apertures 284 through which the restraining bolts pass. The scribe holder is provided with a downwardly extending foot portion 286. Diamond point scribes 288 extend through the foot portion and are adjustably positioned in the desired location with respect to the lower surface of the foot portion by set screws 290.

Figure 12:
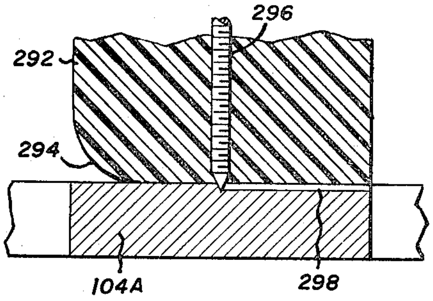
FIG. 12 is a sectional detail of a modified scribing mechanism.

In FIG. 12 a modified form of the scribe holder is shown in which the foot portion 292 is formed of a resilient material, such as nylon or polytetrafluoroethylene, and is formed with a curved forward edge 294. Rather than having a separate scribe and set screw, the scribe 296 is itself adjustably threaded to at least the foot portion of the scribe holder.

Figure 13:
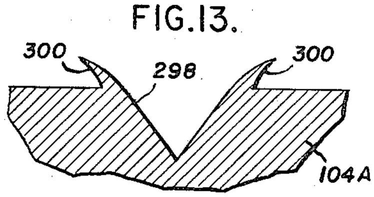
FIG. 13 is a sectional detail of a heat sink after scribing.

In operation of the scribing station B the heat sink strip 104A is advanced along the track bed beneath the foot portion of the scribe holder 282. The scribes 288 are provided with tapered tips that readily ride up over the leading edge of the heat sink strip. In the modified form shown in FIG. 12 the curved leading edge 294 of the foot portion 292 engages the leading edge of the heat sink strip. In either case each scribe forms a groove in the upper surface of the heat sink strip as it is advanced. In the form shown in FIG. 12 the compression springs are provided with sufficient strength that the lower surface of the foot portion rests on the upper edge of the heat sink strip while the projecting portion of the scribe 296 is entirely embedded in the heat sink material. As best seen with reference to FIG. 13, the scribe forms a furrow or groove 298 in the upper surface of the heat sink strip and at least a portion of the displaced metal is thrown up as a burr 300 along opposite flanks of the groove.

Figure 14:
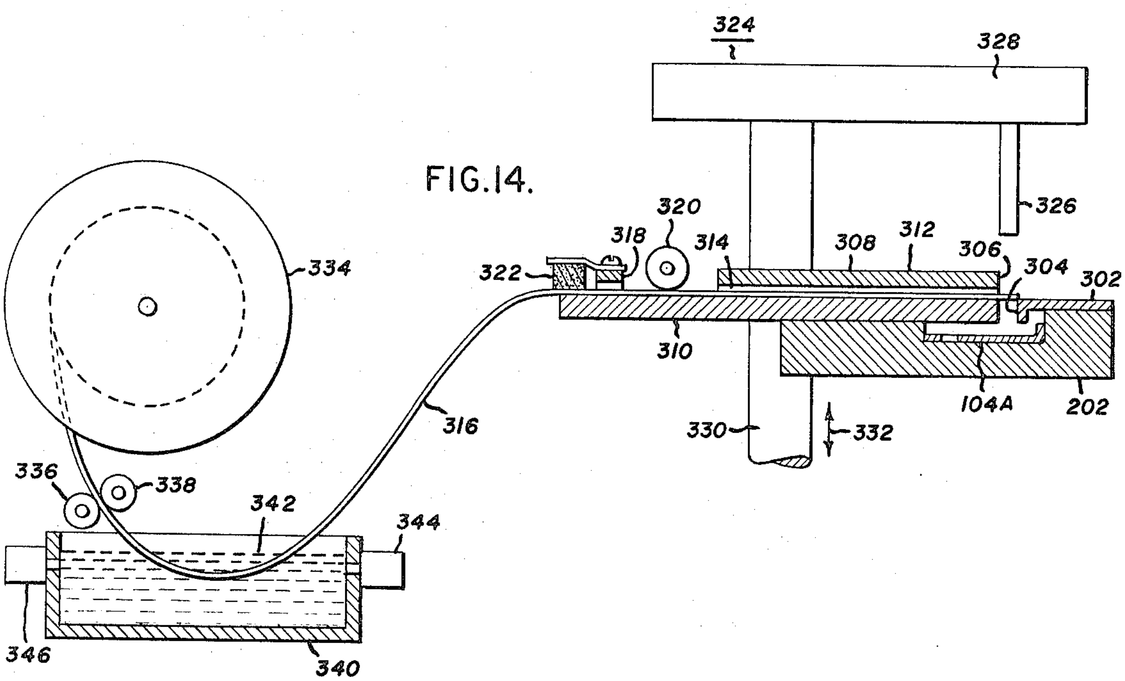
FIG. 14 is a vertical elevation, partly in section, of the preform fastening station.

Station C of our machine is illustrated in FIG. 14. The track 202 supports the heat sink strip 104A as it is advanced from scribing station B. A guide 302 overlies the track and provides a first guide surface 304. Spaced laterally from the first guide surface is a second guide surface 306. The second guide surface is formed by a solder guide track 308 comprised of a bed portion 310 having a cover 312 fixed thereto containing a slot 314. A solder ribbon 316 extends through the slot. An opening 318 is formed in the cover to permit a feed arm 320 to engage the ribbon. A pad 322 supported by the cover frictionally engages the solder ribbon as it is received by the guide track.

A shearing and stamping assembly 324 is provided with a shearing arm 326 mounted by a shearing head 328. The shearing head is mounted by a control arm 330 capable of rectilinear movement along the axis indicated by arrow 332. The shearing arm slidably cooperates with the guide surfaces 304 and 306. The control arm, while free to move vertically with respect to the tracks, is fixed mounted against lateral and rotational movement. For example, the control arm may extend through an aperture in the solder guide track and be splined thereto to prevent rotation.

The solder ribbon is initially stored in a spool 334 rotatably mounted by structure not shown. The ribbon passes through feed rolls 336 and 338 as it emerges from the spool and extends into a trough 340. The trough may contain a liquid shown extending to a level 342. The trough is equipped with a slack monitor comprised of a light source 344 and a light activated receiver 346 capable of generating an electrical signal upon receiving a light signal.

In operation, the heat sink strip 104A is initially positioned as shown by the advancement mechanism previously described. The solder ribbon 316 is initially positioned as shown in FIG. 14 with a portion of the ribbon extending beyond the second guide surface 306 of the solder guide track 308 so that the ribbon extends to or nearly to the first guide surface 304.

To fasten a portion of the solder ribbon to the heat sink strip the control arm is drawn downwardly along the axis indicated by arrow 332. This draws down the shearing arm 326 so that it engages the solder ribbon and, in cooperation with the second guide surface shears a portion of the ribbon to produce a discrete solder preform. The solder preform is restrained against lateral movement by the guide surfaces so that it drops to a location on the heat sink strip directly beneath the shearing arm. After shearing the solder preform free of the solder ribbon, the shearing arm stamps the preform onto the heat sink strip.

Figure 15:
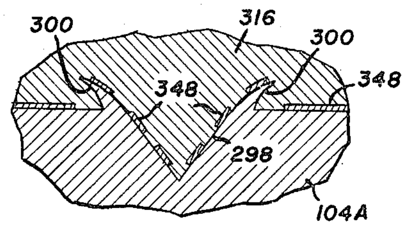
FIG. 15 is a sectional detail of the heat sink strip after scribing and fastening the heat sink.

The scribed area of the heat sink strip is, of course, positioned directly beneath the shearing arm, so that the solder preform engages the burred portions. This has the effect of locking the preform mechanically in position in a manner not always attainable where only stamping is relied upon to achieve mechanical fastening. For example, where the ribbon is formed of an indium solder, we have observed that a satisfactory mechanical bond of the indium solder to the heat sink strip can be achieved even when no burring of the receiving surface of the strip is provided. On the other hand, where a conventional tin or lead containing solder is used which is subject to oxidation upon exposure to the atmosphere, we have observed that stamping alone cannot be relied upon to mechanically fasten the solder preform to the heat sink strip. Further, we have noted that solder preforms of conventional tin and lead composition where positioned on unburred heat sink strip surfaces do not wet these surfaces readily upon melting. We believe that we are able to achieve superior bonding to heat sink strips that have been burred prior to stamping on the solder preform because the burrs form a mechanical interlock with the solder and because the burrs rupture the oxide surface layer associated with the solder preform. This provides not only a better mechanical interlock of the preform and heat sink strip, but also better wetting of the heat sink strip when the solder is heated to its melting temperature. The structural relationship of the heat sink strip 104A and the solder preform 340 is illustrated schematically in FIG. 15. The solder preform is stamped onto the strip surface so that it enters the groove or furrow 298 and is partially penetrated by the burrs 300. This ruptures the thin oxide coating 342 initially associated with the solder preform surface and permits direct association of the heat sink strip and the relatively oxide free internal portions of the solder preform.

Immediately after stamping the solder preform in position the shearing and stamping assembly 324 is lifted vertically by the control arm 330 along the axis indicated by arrow 332. A number of conventional actuating mechanisms capable of imparting rectilinear movement to the control arm may be utilized. The feed arm 320 may then be pushed toward the track through a fixed increment to advance the solder ribbon 316 in the solder guide track 308 so that the ribbon again extends between the guide surfaces 304 and 306. As an alternative the feed arm 320 may be formed as a roller so that it is rotatably mounted and is rotated to advance the ribbon. In the preferred form the feed arm 320 advances the ribbon by being slid to the right through a fixed increment of travel and thereafter is raised above the ribbon and returned to its original position. It is appreciated that this is similar to the sequence of movements by which the fingers advance the heat sink strips. Accordingly, an advancing mechanism may be employed with the feed arm 320 similar to that previously described in connection with the strip advancement mechanism. Where this solder ribbon feeding approach is employed, the pad 322 frictionally engages the ribbon to prevent inadvertent retraction of the ribbon should the feed arm 320 engage the ribbon. After the feed arm 320 has advanced the solder ribbon so that it again projects between the guide surfaces and the heat sink strip is advanced through one stepped increment, the shearing and stamping assembly may again be activated.

To assure that the solder ribbon is fed in a uniform manner it is desirable to maintain slack in the solder ribbon between the solder guide track and the spool 334. This is accomplished by using feed rolls 336 and 338 to pay out the solder ribbon from the spool in a controlled manner. A desired amount of slack is maintained by allowing the ribbon to enter the trough 340 and to interrupt the light beam between light source 344 and light activated receiver 346. As long as the ribbon is present the light activated receiver remains inactive and no ribbon is fed by the feed rolls from the spool. When sufficient ribbon is fed to the solder guide track to raise the ribbon above the light source 344, the light activated receiver 346 generates a signal capable of activating the feed rolls and paying out sufficient ribbon to again interrupt the light beam. For example, the light activated receiver can control a power source for a drive motor associated with one or both of the feed rolls. The trough may be used merely to guide the ribbon. Alternately, the trough may be filled with a liquid where it is desired to clean or otherwise treat the solder prior to association with the heat sink strip.

In some applications it may be desirable to weld the solder preform to the heat sink strip. In such instance the shearing arm can serve as a welding electrode with suitable electrical connections and insulative mounting being provided in the shearing head 328. If desired the shearing arm may be provided with an insulative sleeve. In applications where resistance welding of the solder preform is preferred scribing and/or stamping may be omitted. Where the solder is of a type that readily oxidizes upon exposure to the atmosphere, however, it is preferred that both scribing and stamping preliminary to welding be retained.

Figure 16:
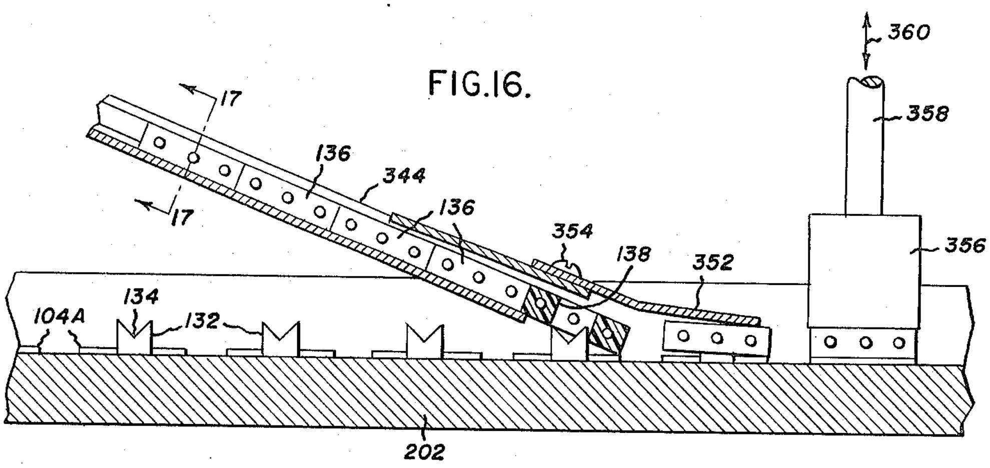
FIG. 16 is a vertical sectional view of the header dispensing station.
Figures 17, 18:
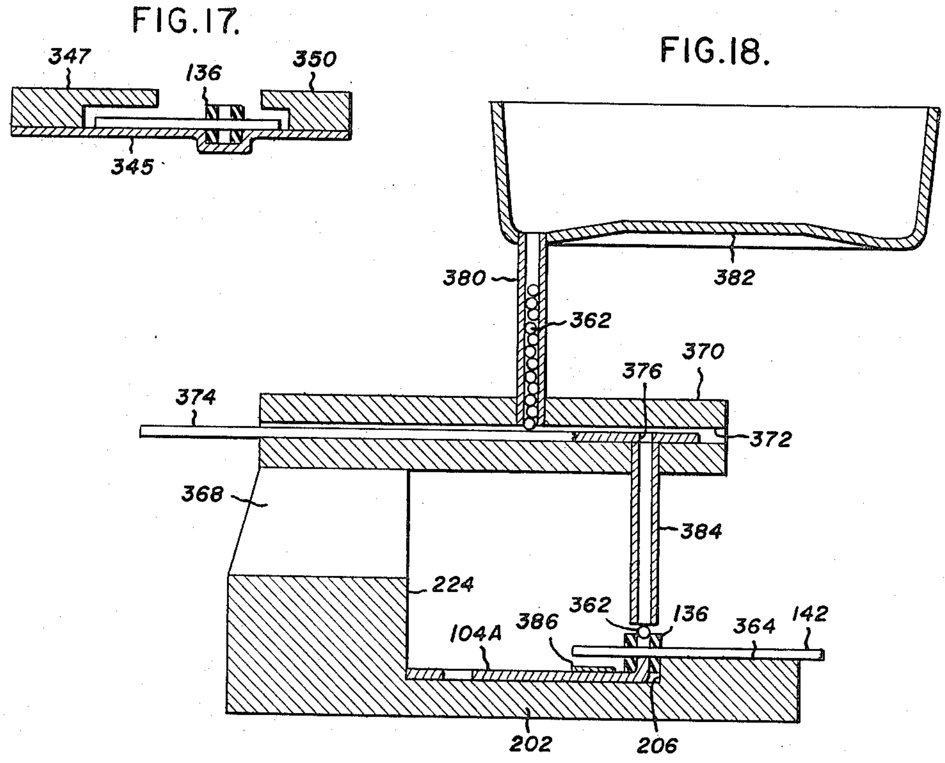
FIG. 17 is a section taken along section line 17—17 in FIG. 16.
FIG. 18 is a vertical sectional view of the solder ball dispensing station.
Figure 19:
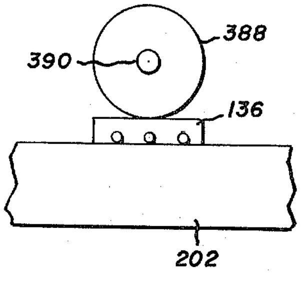
FIG. 19 is an elevation of an arrangement for seating the solder ball.

Station D of our machine is illustrated in FIGS. 16 and 17. The track 202 is shown with a heat sink strip 104A thereon having regularly spaced foot portions with slots 134 therein. A header feed chute 344 is mounted at an acute angle with respect to the track by structure not shown. As best seen in FIG. 17 the chute is comprised of a bed portion 345 which supports the headers together with their associated leads and rail portions 347 and 350 that guide the header-lead subassemblies during their descent through the chute. The upper end of the chute, now shown, may be manually fed with these sub-assemblies or a conventional feeder arrangement may be utilized. The lower edge of the bed portion is located above the upper edge of the foot portions to permit clearance therebeneath. The lowermost header initially drops to a position so that it is held at an angle between the lower end of the chute and the track. As the heat sink strip is advanced the next following adjacent foot portion engages the window 138 and in the next increment of advance pulls the header forward from the chute. A spring clip 352 mounted to the chute by a bolt 354 urges the header downwardly as it is advanced to facilitate seating on the foot portion. To further insure sealing of the header on the foot portion a hammer 356 is provided controlled by an arm 358 capable of vertical movement along an axis indicated by arrow 360.

A solder ball 362 is dispensed to the window of each header associated with a heat sink strip 104A as it is advanced to station E of our machine shown in FIG. 18. At station E the track 202 is provided with guide surface 206 extended somewhat laterally beyond the edge of the heat sink strip 104A to engage the header 136. The second guide surface 224 continues to engage the remaining edge of the heat sink strip. The track provides a surface 364 to the right of the guide surface 206 that supports the leads associated with the headers in horizontal position for sliding movement therealong.

A solder ball dispenser is fixedly mounted with respect to the track by a mounting structure 368. The dispenser includes a dispenser head 370 having a slot 372 therein. A tongue 374 is fitted in the slot having an aperture 376 therein. A feed tube 380 is mounted by the dispenser head so that it communicates with the slot. The feed tube is shown supporting a feed bowl 382, although for most applications the feed bowl will be separately supported and may even support the feed tube. Laterally displaced from the feed tube and also communicating with the slot is a dispenser tube 384.

In operation, the heat sink strip 104A is positioned so that a window of a header 136 underlies the dispenser tube 384. The tongue 374 is then retracted from the position shown so that the aperture 376 therein underlies the feed tube 380. This permits a single solder ball 362 to enter the aperture in the tongue. The tongue is then moved forward until the aperture in the tongue is aligned with the dispenser tube 384. This permits the solder ball to be dropped into the header window. After the heat sink strip is advanced through a stepped increment, the solder ball dispensing procedure may be repeated.

To assure that the solder ball is well seated in the window of the header a compression roller 388 may be rotatably on a shaft 390 as shown in FIG. 9 to urge the solder ball downwardly toward the track. The compression roller may be mounted for compressive engagement with header by a spring biased mounting arrangement similar to that described with regard to the scribing station, only by this case shaft 390 rather than the scribe holder will be urged downwardly by spring bias. Alternately, the compression roller may be fixedly mounted at a predetermined spacing above the track. In a preferred form the solder ball initially projects upwardly somewhat above the upper surface of the header. The compression roller in pushing the solder ball downwardly into the window of the header deforms the solder ball. Where the solder ball is formed of a solder type that forms an oxide surface coating, deforming the solder ball in this manner is advantageous in that it breaks the outer relatively oxidized layer and exposes the center portion of the solder ball which is relatively oxide free for direct bonding to the associated lead and heat sink strip.

Figures 1, 2:
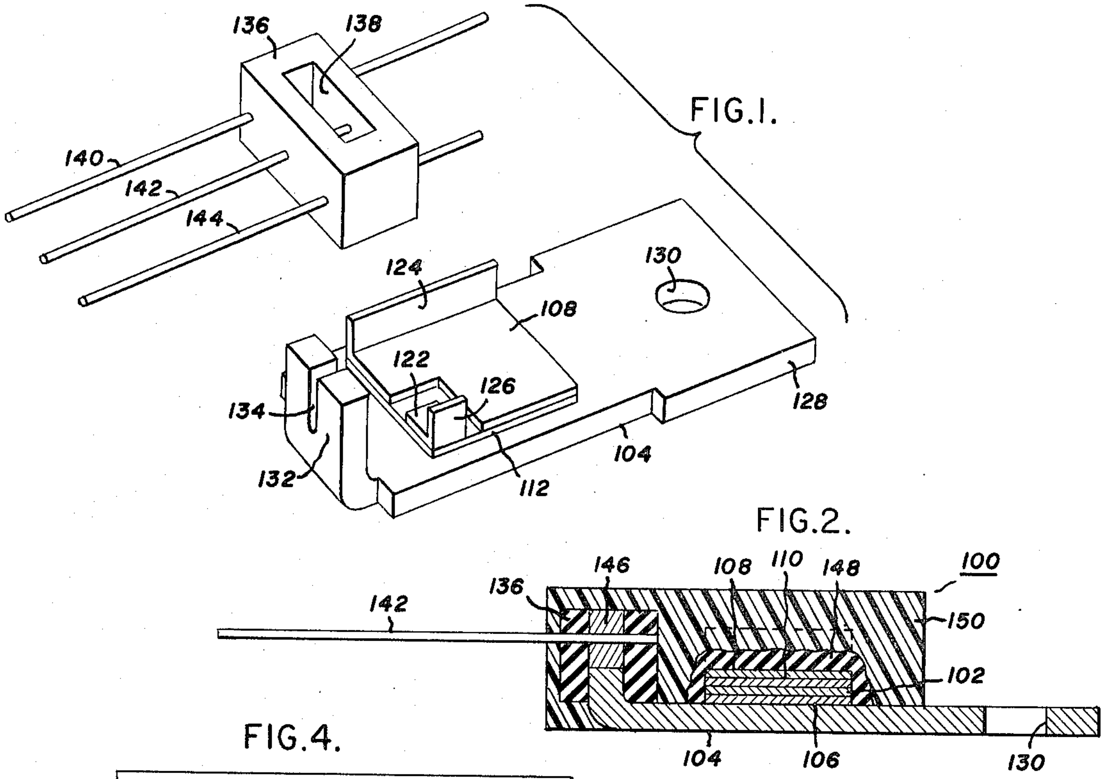
Figure 3:
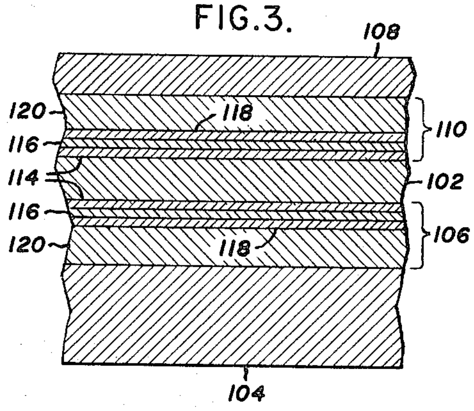

As the heat sink strip 104A advances from station E to the final station of our assembly machine, it carries with it header-lead sub-assemblies associated with each foot portion and a solder ball located within each header window, which corresponds to the solder shown at 146 in FIG. 2. Also, the heat sink strips carry spaced solder preforms 386 fastened to the strip at assembly station C. This corresponds to the lower bonding layer 120 shown in FIG. 3. The remaining device portions to be associated with the heat sink strip by our machine constitute sub-assemblies 392. Referring to FIGS. 1 to 3 inclusive, each sub-assembly 392 is formed of the semiconductor body 102, the contact layers 114, 116, and 118 associated therewith, internal connectors 108 and 122, and the upper bonding layer 120, which is deposited as a backing layer on the internal connectors.

Initially the flange portions 124 and 126 of the internal connectors are not bent to an upstanding position as shown in FIG. 1, but extend laterally outwardly. The sub-assemblies 392 with the flanges of the internal connectors extending laterally outwardly are stacked in a sub-assembly magazine 394, shown in FIG. 20, which illustrates station F of our machine. This magazine is provided with a recess 396 for slidably receiving the sub-assemblies therein and a fluid passage 398 communicating with the lower end of the recess. The sub-assembly magazine is releasably fitted in a holder 400. A fluid conduit 402 is secured to the holder to communicate with the passage in the magazine through a port 404 in the holder. An O-ring seal 406 is mounted concentrically with the port to engage and seal between the magazine and holder to prevent fluid from escaping therebetween.

Figures 20, 21, 22:
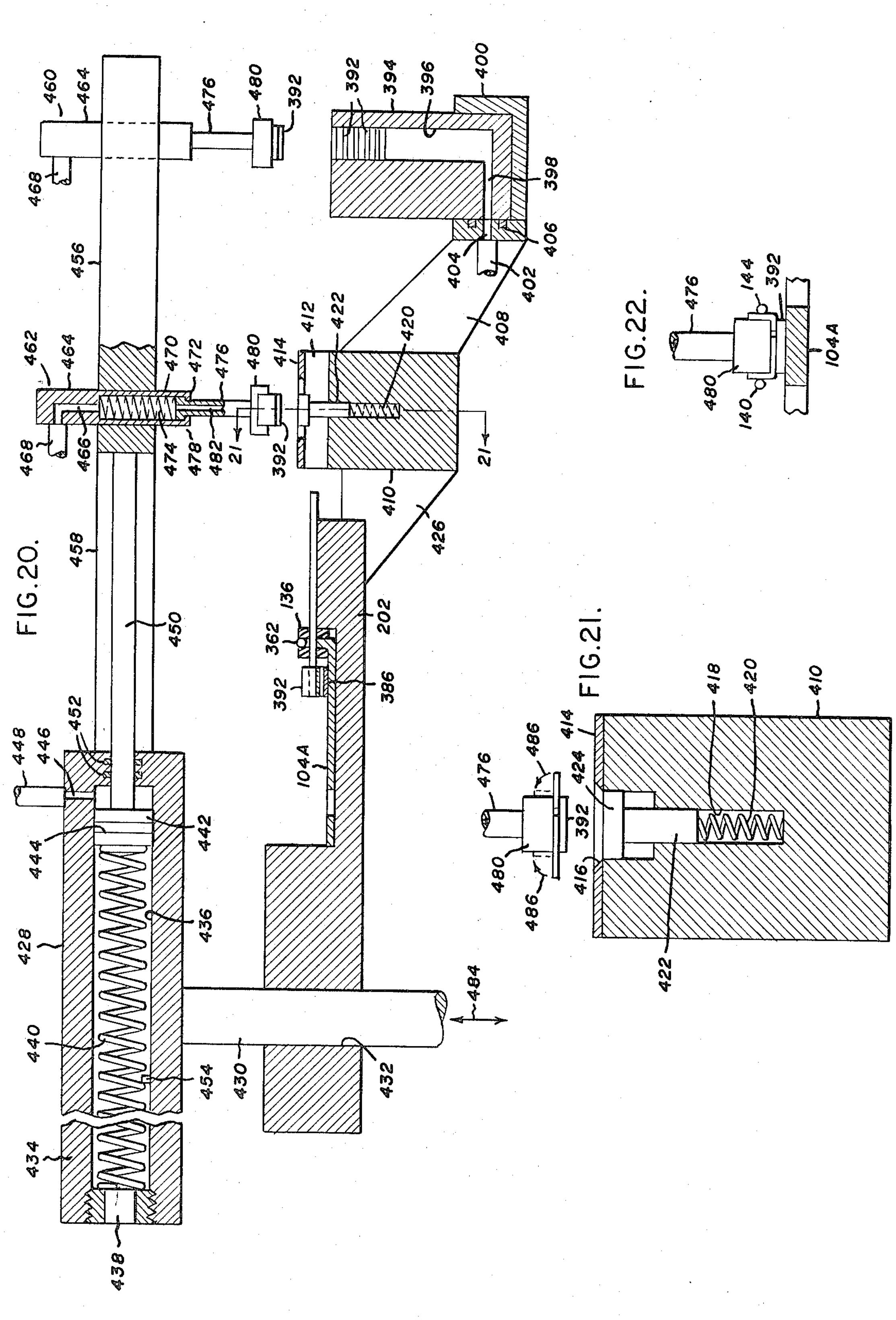
FIG. 20 is an elevation, with parts in section, of the sub-assembly positioning station.
FIG. 21 is a sectional view taken along section line 21—21 in FIG. 20.
FIG. 22 is a detail showing the relationship of the vacuum pencil and sub-assembly when the sub-assembly is being positioned on the heat sink strip.

The magazine holder is fixedly positioned by a mounting plate 408 secured to forming the die 410 shown in FIGS. 20 and 21. The die includes a forming or bending slot 412. Guide plates 414 overlie the upper surfaces of the die on opposite sides of the slot and are provided with beveled (preferably convex) surfaces 416 adjacent the slot. A bore 418 is provided in the trough of the slot and contains a compression spring 420 therein. Supported on the compression spring is a plunger 422 having a lower portion that slidably fits within the bore and an upper pedestal 424 that slidably fits within the slot. The forming die is mounted in fixed position relative to the track by a mounting member 426.

Located in fixed lateral and rotational relation to the track is a pick up assembly 428 mounted by a control arm 430 slidably fitted within an aperture 432 in the track. The control arm may be splined to the track to prevent relative rotation, if desired. The pick up assembly includes a lateral operator housing 434 defining a cylinder wall 236. A bushing 438 is threadedly fitted to the operator housing at one end of the cylinder wall. The bushing provides a fixed stop for a lateral biasing spring 440. Sealingly and slidably cooperating with the cylinder wall and engaging the opposite end of the biasing spring is a piston 442 fitted with seal rings 444. The operator housing is provided with a port 446 for delivering a fluid through conduit 448 to actuate the piston. The cylinder wall is provided with a stop 454 to limit lateral travel of the piston in compressing the lateral biasing spring. The piston has connected thereto a rod 450 slidably and sealingly cooperating with O-ring seals 452 carried by the operator housing.

The rod 450 has attached thereto a vacuum pencil holder 456. The rod and holder may be restrained from rotation with respect to the lateral operator housing by any one of a variety of techniques. In a simple form the holder may be provided with a rearwardly extending guide arm 458 that slidably cooperates with an external surface of the lateral operator housing. The holder fixedly mounts vacuum pencils 460 and 462, which may be of identical construction. Each holder is comprised of a mounting section 464 having a passage 466 therein extending between a communicating fluid conduit 468 and an integral shroud 470 carrying a stop 472 at its lower end. A spring 474 located within the shroud biases a plunger 476 downwardly. The plunger carries a shoulder 478 at its upper end to cooperate with the stop 472 in preventing total ejection of the plunger from the shroud. At its lower end the plunger carries a pick up tip 480. A passage 482 extends longitudinally through the plunger and its pick up tip. The vacuum pencil 460 may be somewhat simpler than the vacuum pencil 462 in construction, if desired, in that the plunger may be fixedly fastened to the lower end of the mounting section. This, of course, eliminates any need of a spring 474.

Operation of our machine at station F is most easily understood by initially considering the situation in which the heat sink strip 104A is one stepped increment from advancement to this station—i.e., one step short of the position shown in FIG. 20. At this time the control arm 430 is raised vertically along an axis indicated by arrow 484. Fluid pressure is also bled from the lateral operator housing 434 through conduit 448 to permit the lateral biasing spring 440 to urge the piston 442 into the position shown in FIG. 20. This also positions the rod 450 and vacuum pencil holder 456 laterally in the position shown.

The control arm is then moved downwardly along the axis indicated by arrow 484 until the pick up tip 480 of the vacuum pencil 460 reaches or approaches the upper surface of the sub-assembly magazine 394. At this time the pick up tip is in vertical alignment with the recess 396. Fluid pressure is then applied to the lower end of the recess through conduit 402 and passage 398. This levitates the sub-assemblies 392 in the recess so that the upper sub-assembly approaches the pick up tip. At this time a negative pressure or vacuum is formed within the passage of the pick up tip by means of the external conduit 468. The uppermost sub-assembly is then picked up by the pick up tip and held in position by the pressure differential between its upper and lower surfaces.

The operator arm is now moved again vertically upwardly and fluid pressure is applied to the lateral operator housing through conduit 448 to shift the piston against the lateral biasing spring to the stop 454. This moves the rod and the vacuum pencil holder so that the vacuum pencil 460 is vertically aligned with the plunger 422 of the bending die 410. The control arm is now moved vertically downwardly to move the pick up tip 480 downwardly. The sub-assembly 392 is initially compressively engages between the pickup tip and the pedestal 424 of the plunger. As the vacuum pencil 460 continues downward movement the semiconductor body and overlying portions of the internal connectors are held in compressin while the laterally extending flange portions are bent upwardly as indicated by arrows 486 in FIG. 21. Bending or forming occurs as the vacuum pencil 460 presses down against the plunger 422 and compresses the spring 420, so that the pedestal, sub-assembly, and pick up tip enter the slot 412 of the bending die. As soon as forming is complete the vacuum applied to the vacuum pencil is removed. At this point the vacuum pencil 460 no longer holds the sub-assembly 392 having its internal connectors turned upwardly.

This sub-assembly is accordingly left on the pedestal 424 while the control arm is again moved vertically upwardly and the piston is again actuated to the position shown in FIG. 20. This positions the vacuum pencil 462 above the pedestal. The control arm is again moved downwardly and a vacuum applied to the vacuum pencil 462 through conduit 468. The sub-assembly with the formed connectors is then held by the pick up tip of the pencil 462. The control arm is again moved upwardly and the piston actuated so that it engages the stop 454. The heat sink strip 104A has by this time been advanced to the position shown in FIG. 20, and the vacuum pencil is located so that it vertically overlies the solder preform 386. The control arm is now moved vertically downwardly again so that the pick up tip 480 of the vacuum pencil 462 pushes the sub-assembly 392 into the desired assembly position between the leads 140 and 144, as is shown in FIG. 22. The spring 474 protects the sub-assembly against excessive downward compression by the vacuum pencil. The vacuum applied to the vacuum pencil 462 is then released and the control arm is raised to raise the vacuum pencil 462 leaving the sub-assembly 392 in position on the heat sink. While the drawings show the flange portions of the sub-assembly to be bent upwardly at right angles, the flanges are preferably turned up at an angle slightly less than ninety degrees to assure a frictional engagement with the leads and to lessen the frictional engagement with the pick up tip.

It is apparent that during steady state operation the vacuum pencil 460 is feeding the vacuum pencil 462 with sub-assemblies by replacing the sub-assemblies which the vacuum pencil 462 picks up at the forming die and transports to the heat sink strip. When the supply of sub-assemblies in the magazine is depleted, the magazine may be replaced with a fully loaded magazine without interrupting the assembly operation. The conduits 468 may, of course, be formed of flexible material so that they do not restrain lateral movement of the vacuum pencil holder. Instead of using the vacuum pencil 460 to turn up the flange portions of the internal connectors, the vacuum pencil 460 may merely position the sub-assemblies on the forming die. The vacuum pencil 462 can then be relied upon to both form and transport the sub-assemblies. This is advantageous, since only one vacuum pencil thus needs to engage the formed sub-assemblies, thereby minimizing any difficulties in relating the vacuum pencil 462 to pre-formed sub-assemblies.

The heat sink strip as it emerges from station F or our machine has associated therewith headers, leads, solder preforms, semiconductor bodies, contacts, and internal connectors. At this point the elements are not encapsulated, bonded together, or separated into discrete devices. This can be readily accomplished by techniques well known to the art. For example, the strip with the elements assembled thereon can be passed through a heated tunnel oven to melt the solder and achieve bonding to the leads, internal connectors, and heat sink simultaneously in a single operation. Therefore a passivant material may be associated with the semiconductor bodies, such as silicone rubber, and suitably cured. A housing can then be molded around each semiconductor body on the strip, and the strip can then be severed into discrete units to complete the manufacture of the semiconductor devices.

While we have disclosed our invention with reference to a specific preferred embodiment of our assembly machine and by reference to a specific semiconductor device which may be assembled thereby, it is appreciated that numerous variations may be made both in our assembly machine and in the device to be assembled without departing from the teaching. Instead of using a magazine to feed heat sink strips at station A of our machine, the strips may be individually supplied to the machine by hand feeding. It is to be appreciated, of course, that this is comparatively inefficient. For some types of bonding materials no scribing of the heat sink strip may be required to achieve fastening of the bonding material. For many common types of solder, however, burring of the heat sink is essential to achieve mechanical fastening. Further, scribing can extend the useful life of solder ribbons, since this allows much thicker surface oxide coatings to be tolerated and still achieve wetting of the solder to the semiconductor body and heat sink. The scribing station may, of course, be omitted and this operation performed by hand, if desired. Header mounting and solder ball dispensing could also be done by hand and these stations omitted, if desired, although this would be much less efficient than using our machine stations. Instead of using a vacuum pencil 460 operated by a machine, the sub-assemblies may be transferred to the forming die manually or with a manually operated vacuum pencil. While we have disclosed the operation of each of the stations of our machine independently, it is appreciated that controls can be provided for automatically operating the various stations in timed relation to each other. In this way our machine can be controlled by a single operator. This would require no more than routine skill and accordingly has not been disclosed or discussed in connection with our machine.

It is intended that the scope of our invention be determined by reference to the following claims.

What we claim and desire to secure by Letters Patent of the United States is:

1. A process for the assembly of a plurality of semiconductor devices having heat sinks initially united in a common strip comprising
- advancing a heat sink strip along a track,
- burring the heat sink strip,
- associating bonding preforms having oxidized surfaces with the burred portions of the heat sink strip at spaced intervals so that the oxidized surfaces are penetrated by the burrs and the solder preforms are fastened to the strip,
- insulatively positioning leads at spaced intervals along the heat sink strip,
- superimposing a sub-assembly comprised of a semiconductor body and an internal connector over each bonding preform and simultaneously positioning each internal connector to contact a lead with a bonding material interposed therebetween,
- simultaneously bonding the internal connectors to the leads and the semiconductor bodies to the heat sink strip,
- protectively encapsulating the semiconductor bodies, and
- sub-dividing the strip to form plural discrete semiconductor devices.

2. A process according to claim 1 additionally including the step of transporting the sub-assemblies from a magazine to the heat sink strip and bending the internal connectors at an intermediate transport station.

3. A process for the assembly of a plurality of semiconductor devices having heat sinks initially united in a common strip comprising
- advancing a heat sink strip along a track in stepped increments,
- burring the heat sink strip, sequentially urging first solder preforms having oxidized surfaces into association with burrs on the heat sink strip at spaced intervals so that the oxidized surfaces are penetrated by the burrs and the solder preforms are fastened to the strip, sequentially associating leaded headers with the heat sink strip at spaced intervals, sequentially associating relatively oxide free center portions of second solder preforms with the heat sink strip and a first lead carried by each header, sequentially superimposing a sub-assembly comprised of a semiconductor body and a solder clad internal connector over each first solder preform with the solder clad internal connectors each being associated with a remaining lead of each header, heating the heat sink strip simultaneously to solder the semiconductor bodies to the heat sink strip, the first lead of each header to the heat sink strip, and a remaining lead of each header to the internal connector, protectively encapsulating the semiconductor bodies, and sub-dividing the strip to form discrete semiconductor devices.

* * * * *